United States Patent
Shelnut et al.

(10) Patent No.: US 6,842,577 B2
(45) Date of Patent: Jan. 11, 2005

(54) PHOTOIMAGEABLE WAVEGUIDE COMPOSITION AND WAVEGUIDE FORMED THEREFROM

(75) Inventors: James G. Shelnut, Northboro, MA (US); Matthew L. Moynihan, Sterling, MA (US); Omari Patterson, Boston, MA (US)

(73) Assignee: Shipley Company L.L.C., Marlborough, MA (US)

( * ) Notice: Subject to any disclaimer, the term of this patent is extended or adjusted under 35 U.S.C. 154(b) by 0 days.

(21) Appl. No.: 10/307,904

(22) Filed: Dec. 2, 2002

(65) Prior Publication Data

US 2004/0105652 A1 Jun. 3, 2004

(51) Int. Cl.[7] .................................................. G02B 6/00
(52) U.S. Cl. ...................................... 385/143; 385/141
(58) Field of Search ................................ 385/141–145

(56) References Cited

U.S. PATENT DOCUMENTS

| | | | |
|---|---|---|---|
| 5,200,487 A | 4/1993 | Lagarde et al. | |
| 5,378,585 A | 1/1995 | Watanabe | |
| 5,457,003 A | 10/1995 | Tanaka et al. | |
| 5,554,465 A | 9/1996 | Watanabe | |
| 5,612,170 A | 3/1997 | Takemura et al. | |
| 5,672,672 A | 9/1997 | Amano et al. | |
| 6,054,253 A | 4/2000 | Fardad et al. | |
| 6,087,064 A | 7/2000 | Lin et al. | |
| 6,088,492 A | 7/2000 | Kaneko et al. | |
| 6,144,795 A | 11/2000 | Dawes et al. | |
| 6,251,486 B1 | 6/2001 | Chandross et al. | |
| 6,344,305 B1 | 2/2002 | Lin et al. | |
| 6,731,857 B2 * | 5/2004 | Shelnut et al. | 385/143 |
| 2002/0150368 A1 | 10/2002 | Imoto | |
| 2003/0123806 A1 | 7/2003 | Erben | |
| 2004/0005132 A1 | 1/2004 | Erben et al. | |

FOREIGN PATENT DOCUMENTS

| | | |
|---|---|---|
| EP | 0 543 761 A1 | 5/1993 |
| JP | 57-168246 | 10/1982 |
| JP | 58-096654 | 6/1983 |
| JP | 63-279245 | 11/1988 |
| JP | 04-271306 | 9/1992 |
| JP | 04-366958 | 12/1992 |
| JP | 06-172533 | 6/1994 |
| JP | 6-172533 | 6/1994 |
| JP | 6-256523 | 9/1994 |
| JP | 8-259895 | 10/1996 |
| JP | 8-304644 | 11/1996 |
| JP | 8-327842 | 12/1996 |
| JP | 10-148729 | 6/1998 |
| JP | 10-253845 | 9/1998 |
| JP | 31 33039 | 11/2000 |
| JP | 2003-3048984 A | 2/2003 |
| WO | WO 98/26315 | 6/1998 |

OTHER PUBLICATIONS

Bagley et al., "The Processing and Use of Organosilicon Polymers for Photonic Applications"; Polymer Engineering and Science, Mid–Sep. 1989, vol. 29, No. 17, pp. 1197–1199.

Brault et al., "Bilevel Polysiloxane Resist for Ion–Beam and Electron–Beam Lithography"; SPIE vol. 539 Advances in Resist Technology and Processing II (1985); pp. 70–73.

Search Report for European Application No. 03257559.9, filed Dec. 1, 2003.

* cited by examiner

Primary Examiner—Phan T. H. Palmer
(74) Attorney, Agent, or Firm—Jonathan D. Baskin

(57) ABSTRACT

Provided are photodefinable compositions suitable for use in forming an optical waveguide. The compositions include a silsesquioxane polymer having polymerized units of the formula $(R^1SiO_{1.5})$ and $(R^2SiO_{1.5})$, wherein $R^1$ and $R^2$ are different and are substituted or unsubstituted organic side chain groups and are free of hydroxy groups, and two or more functional end groups, and a photoactive component. The solubility of the silsesquioxane polymer is altered upon exposure to actinic radiation such that the composition is developable in an aqueous developer solution. Also provided are methods of forming an optical waveguide with the inventive compositions, optical waveguides, and electronic devices including one or more optical waveguide.

40 Claims, No Drawings

PHOTOIMAGEABLE WAVEGUIDE COMPOSITION AND WAVEGUIDE FORMED THEREFROM

BACKGROUND OF THE INVENTION

The present invention relates generally to the field of waveguides. In particular, the present invention relates to photodefinable compositions suitable for use in forming optical waveguides. The invention further relates to methods of forming optical waveguides. As well, the invention relates to optical waveguides and to electronic devices that include an optical waveguide.

Light is becoming increasingly important in the transmission of data and communications. For example, fiber optic cables have replaced conventional electrical cables in a number of applications. Optical waveguides typically include a core material and a cladding layer surrounding the core material. Optical radiation propagates in the core material and is contained by the cladding layer, which has a lower index of refraction than the core material. Waveguides may be used individually or as an array supported on a substrate, and typically transmit optical radiation across a substrate surface. The waveguides often perform a passive function on the optical radiation so as to modify the output signal from the input signal in a particular way. For example, splitters divide an optical signal in one waveguide into two or more waveguides; couplers add an optical signal from two or more waveguides into a smaller number of waveguides; and wavelength division multiplexing ("WDM") structures separate an input optical signal into spectrally discrete output waveguides, usually by employing either phase array designs or gratings. Spectral filters, polarizers, and isolators may be incorporated into the waveguide design. Waveguides may alternatively contain active functionality, wherein the input signal is altered by interaction with a second optical or electrical signal. Exemplary active functionality includes amplification and switching such as with electro-optic, thermo-optic or acousto-optic devices.

Known methods of manufacturing waveguides include, for example, manually placing glass fibers into hollowed out areas on a substrate; filling a mold of a desired structure with a polymeric material that is thermally cured and later removed from the mold; and depositing a bulk waveguide material on a substrate, followed by standard photolithography and etching patterning processes using a photoresist on the bulk waveguide layer. Each of these processes has drawbacks, however, such as requiring multiple steps to define the waveguide, potential sidewall roughness issues, limited resolution, and increased labor costs.

The use of photoimageable materials in forming waveguides has also been proposed. Such materials are beneficial in that waveguides can be formed using fewer processing steps than the above-mentioned conventional processes. In developing the present invention, the use of various hydroxybenzylsilsesquioxanes to create a photoimageable waveguide has been proposed. It was thought that provision of hydroxy groups on the phenyl ring side groups would allow for development of the composition in aqueous hydroxide solutions. From a processing standpoint, the ability to use an aqueous developer solution in place of a solvent- (i.e., organic-) based developer is desirable for various reasons. For example, aqueous developers can be safely disposed of in an environmentally friendly manner and pose no health risk to those persons handling such materials, in contrast to solvent-based developers. It has since been determined, however, that the optical loss characteristics for waveguides formed from the proposed hydroxybenzylsilsesquioxane materials is higher than desired at certain wavelengths. For example, relatively high absorption at 1550 nm wave energy, one of the important wavelengths employed in the optoelectronics industry, has been observed in such materials. The result is optical loss at that wavelength. Such loss is believed to be due to an excessively high content of hydroxy groups in the photoimageable material.

There is thus a need in the art for compositions suitable for use in manufacturing photoimageable optical waveguides having improved optical loss characteristics while also maintaining developability in an aqueous developer solution. As well, there is a need in the art for waveguides formed from these compositions, for methods of forming such waveguides, and for opto-electronic devices which include such waveguides.

SUMMARY OF THE INVENTION

It has surprisingly been found that optical waveguides can be easily prepared using the photodefinable compositions of the present invention.

In one aspect, the present invention provides a photodefinable composition suitable for use in forming an optical waveguide. The composition includes: a silsesquioxane polymer, that includes polymerized units of the formula $(R^1SiO_{1.5})$ and $(R^2SiO_{1.5})$, wherein $R^1$ and $R^2$ are different and are substituted or unsubstituted organic side chain groups and are free of hydroxy groups, and two or more functional end groups; and a photoactive component. The solubility of the silsesquioxane polymer is altered upon exposure to actinic radiation such that the composition is developable in an aqueous developer solution.

In a second aspect, the present invention provides a photodefinable composition suitable for use in forming an optical waveguide. The composition includes: a silsesquioxane polymer, that includes polymerized units of the formula $(RSiO_{1.5})$, wherein R is a substituted or unsubstituted organic side chain group that is free of hydroxy groups, and one or more hydroxy end groups; and a photoactive component. The silsesquioxane polymer has a hydroxy content of from 0.5 to 15 mole %.

In a third aspect, the present invention provides methods of forming an optical waveguide with the inventive compositions. The methods involve: (a) depositing over a substrate a layer of the inventive photodefinable composition, wherein the layer has a higher refractive index than the substrate; (b) exposing a portion of the layer to actinic radiation; and (c) developing the exposed layer, thereby forming a core structure.

In a fourth aspect, the present invention provides optical waveguides having a core and a cladding. The core is formed from the inventive photodefinable composition.

In a fifth aspect, the present invention provides electronic devices including one or more of the inventive waveguides.

DETAILED DESCRIPTION OF THE INVENTION

The present invention provides photodefinable compositions suitable for use in forming an optical waveguide. The compositions are based on silsesquioxane polymers. Unless otherwise specified, amounts for components of the composition are given in weight % based on the composition absent any solvent. As used herein, the term "polymer"

includes oligomers, dimers, trimers, tetramers and the like, and encompasses both homopolymers and copolymers, i.e., polymers formed from two or more different monomer units. The term "alkyl" refers to linear, branched and cyclic alkyl. Also as used herein, the term "developable in an aqueous developer solution" means that, in the case of a negative-working material, the composition, when (i) coated to a dried thickness of 8 µm on a silicon wafer, and (ii) then placed in a 2N NaOH developer solution, a 2N KOH developer solution, or a 2N TMAH developer solution, preferably a 1N solution thereof, more preferably a 0.7N solution thereof, even more preferably a 0.26N solution thereof at a temperature of from 70 to 100° F. (21 to 37.8° C.) with aggressive agitation, is completely dissolved within ten minutes, preferably within two minutes, even more preferably within one minute, and still more preferably within 30 seconds. In the case of a positive-working material, this term has the same definition, except that the dried coating would be exposed to 1000 mJ/cm$^2$ of actinic radiation between the coating and development.

The silsesquioxane polymers useful in the present invention include polymerized units of the formula ($RSiO_{1.5}$). R refers to a substituted or unsubstituted organic side chain group that is free of hydroxy groups. It is believed that the presence of hydroxy groups on the side chain group causes excessive optical loss at common wavelengths employed in the optoelectronics industry. Exemplary R groups include substituted and unsubstituted alkyl and aryl groups. Such alkyl groups can be straight chain, branched or cyclic having, for example, from 1 to 20 carbon atoms, typically a straight chain or branched alkyl group having from 1 to 20 carbon atoms, such as methyl, ethyl, n-propyl, isopropyl, t-butyl, t-amyl, t-octyl, decyl, dodecyl, cetyl, stearyl, cyclohexyl and 2-ethylhexyl. Exemplary aryl groups include those having from 6 to 20, typically from 6 to 15, carbon atoms, such as phenyl, tolyl, 1-naphthyl, 2-naphthyl and 2-phenanthryl.

The polymer can be a silsesquioxane homopolymer, in which case the present silsesquioxane polymers have the general formula $(RSiO_{1.5})_n$, wherein R is as described above, and n is an even integer greater than zero. Exemplary silsesquioxane homopolymers include alkyl silsesquioxanes such as methyl silsesquioxane, ethyl silsesquioxane, propyl silsesquioxane, n-butyl silsesquioxane, iso-butyl silsesquioxane, tert-butyl silsesquioxane, and the like, and aryl silsesquioxanes such as phenyl silsesquioxane and tolyl silsesquioxane.

Alternatively, the polymer can take the form of a copolymer, either a random- or block-type. The copolymer can be, for example, a combination of two or more different types of silisesquioxane units, typically two or three different types of units, with the proportions for each unit ranging from 1 to 99 mole %. In a preferred aspect of the invention, the silsesquioxane copolymer includes polymerized units of the formula ($R^1SiO_{1.5}$) and ($R^2SiO_{1.5}$), wherein $R^1$ and $R^2$ are different and are as described above with reference to R. The copolymer can be, for example, an alkyl/aryl silsesquioxane such as a copolymer containing methyl silsesquioxane and phenyl silsesquioxane or containing methyl silsesquioxane, ethyl silsesquioxane, and phenyl silsesquioxane; an alkyl silsesquioxane copolymer such as a copolymer containing methyl silsesquioxane and ethyl silsesquioxane; or an aryl silsesquioxane copolymer such as a copolymer containing phenyl silsesquioxane and tolyl silsesquioxane. When more than one type of silsesquioxane units are used, it is preferred that at least one organic moiety be selected from aryls and at least one from alkyls.

The polymer can optionally include one or more non-silsesquioxane units, in addition to the silsesquioxane units. In some circumstances, it may be beneficial to incorporate such non-silsesquioxane polymerizable units into the copolymer to achieve desired properties, for example, to impart additional flexibility to the polymer. Such non-silsesquioxane units can be, for example, polymerized units of the formula (($R^3)_2SiO$), wherein $R^3$ is a substituted or unsubstituted organic group, such as an alkyl group, for example, methyl, ethyl, propyl, and the like, or an aryl group, for example, phenyl, tolyl, and the like. The copolymer can alternatively include a single type of silsesquioxane unit as defined above, together with one or more such polymerized non-silsesquioxane units.

As described above, the side chain groups of the polymer can be optionally substituted. "Substituted" means that one or more hydrogen atoms on the side chain groups is replaced by another substituent group, for example, deuterium, halogen such as fluorine, bromine, and chlorine, ($C_1$–$C_6$)alkyl, ($C_1$–$C_6$)haloalkyl, ($C_1$–$C_{10}$)alkoxy, ($C_1$–$C_{10}$)alkylcarbonyl, ($C_1$–$C_{10}$)alkoxycarbonyl, ($C_1$–$C_{10}$)alkylcarbonyloxy, and the like.

The silsesquioxane polymers may contain a wide range of repeating units. The silsesquioxane polymers useful in the present invention may have, for example, from 5 to 150 repeating units, typically from about 10 to 35 repeating units. Thus, the silsesquioxane polymer may vary widely in molecular weight. Typically, the polymers have a weight average molecular weight ($M_w$) of from about 500 to 15,000, more specifically from about 1000 to 10,000, even more specifically from about 1000 to 5000. It has been found that the dissolution rate of the compositions in accordance with the invention in an aqueous developer decreases with an increase in the molecular weight $M_w$ and $M_n$.

The silsesquioxane polymers can further include two or more functional end groups that allow condensation polymerization to occur. Such end groups can be, for example, hydroxy, alkoxy such as ethoxy, propoxy, isopropoxy, carboxyester, amino, amido, epoxy, imino, carboxyacid, anhydride, olefinic, acrylic, acetal, orthoester, vinyl ether, and combinations thereof. Of these, hydroxy groups are preferred.

The hydroxy content in the polymer is typically from about 0.5 to 15 mole % based on the polymer, more specfically from about 1 to 10 mole %, even more specifically from about 2 to 5 mole %.

The silsesquioxane polymers of the present invention are typically free of acid containing groups, such as carboxylic acid and sulfonic acid groups. Such acid containing groups may, however, be desirable in certain circumstances.

The silsesquioxane polymer is typically present in the composition in an amount of from 1 to 99.5 wt %, more specifically from 60 to 98.5 wt %.

The described polymer materials are generally commercially available or may be prepared by known methods. For example, a 1:1 methyl phenyl silsesquioxane copolymer can be synthesized by condensation reaction of 50% methyl-triethoxy-silane and 50% phenyl-triethoxy-silane.

A photoactive component is also present in the composition to alter the solubility of the polymer upon exposure to actinic radiation. In the case of a negative working material, the photoactive component catalyzes coupling of exposed portions of the silsesquioxane polymer, rendering the coupled portions insoluble in an aqueous developer. A wide variety of photoactive components may be used in the present invention, including, but not limited to, photoacid generators and photobase generators. Of these, photoacid generators are preferred.

The photoacid generators useful in the present invention can be any compound or compounds which liberate acid upon exposure to light. Suitable photoacid generators are known and include, but are not limited to, halogenated triazines, onium salts, sulfonated esters, substituted hydroxyimides, substituted hydroxylimines, azides, naphthoquinones such as diazonaphthoquinones, diazo compounds, and combinations thereof.

Particularly useful halogenated triazines include, for example, halogenated alkyl triazines such as the halomethyl-s-triazines. The s-triazine compounds are condensation reaction products of certain methyl-halomethyl-s-triazines and certain aldehydes or aldehyde derivatives. Such s-triazine compounds may be prepared according to the procedures disclosed in U.S. Pat. No. 3,954,475 and Wakabayashi et al., *Bulletin of the Chemical Society of Japan*, 42, 2924–30 (1969). Other triazine type photoacid generators useful in the present invention are disclosed, for example, in U.S. Pat. No. 5,366,846, the entire contents of which are herein incorporated by reference.

Onium salts with weakly nucleophilic anions are particularly suitable for use as photoacid generators in the present invention. Examples of such anions are the halogen complex anions of divalent to heptavalent metals or non-metals, for example, antimony, tin, iron, bismuth, aluminum, gallium, indium, titanium, zirconium, scandium, chromium, hafnium, copper, boron, phosphorus and arsenic. Examples of suitable onium salts include, but are not limited to, diazonium salts such as diaryl-diazonium salts and onium salts of group VA and B, IIA and B and I of the Periodic Table, for example, halonium salts such as iodonium salts, quaternary ammonium, phosphonium and arsonium salts, sulphonium salts such as aromatic sulfonium salts, sulfoxonium salts or selenium salts. Examples of suitable onium salts are disclosed, for example, in U.S. Pat. Nos. 4,442,197; 4,603,101; and 4,624,912, the entire contents of which patents are incorporated herein by reference. Sulfonium salts such as triphenylsulfonium hexafluorophosphates and mixtures thereof are preferred.

The sulfonated esters useful as photoacid generators in the present invention include, for example, sulfonyloxy ketones. Suitable sulfonated esters include, but are not limited to, benzoin tosylate, t-butylphenyl alpha-(p-toluenesulfonyloxy)-acetate, 2,6-dinitrobenzyl tosylate, and t-butyl alpha-(p-toluenesulfonyloxy)-acetate. Such sulfonated esters are disclosed, for example, in the *Journal of Photopolymer Science and Technology*, vol. 4, No. 3,337–340 (1991), the entire contents of which are incorporated herein by reference.

Substituted hydroxyimides which can be used include, for example, n-trifluoromethylsulfonyloxy-2,3-diphenylmaleimide and 2-trifluoromethylbenzenesulfonyloxy-2,3-diphenylmaleimide. Suitable substituted hydroxylimines include, for example, 2-(-nitrilo-2-methylbenzylidene)-(5-hydroxyiminobutylsulfonyl)-thiophene. Azides useful in the present invention include, for example, 2,6-(4-azidobenzylidene)cyclohexanone. Naphthoquinones can include, for example, 2,1-diazonaphthoquinone-4-sulfonate ester of 2,3,4-trihydroxybenzophenone. Among the diazo compounds, 1,7-bis(4-chlorosulonyl phenyl)-4-diazo-3,5-heptanedione can be used.

Photobase generators useful in the present invention can be any compound or compounds which liberate base upon exposure to light. Suitable photobase generators include, but are not limited to, benzyl carbamates, benzoin carbamates, O-carbamoylhydroxyamines, O-carbamoyloximes, aromatic sulfonamides, alpha-lactams, N-(2-allylethenyl)amides, arylazide compounds, N-arylformamides, 4-(ortho-nitrophenyl)dihydropyridines, and combinations thereof.

The amount of photoactive component useful in the present invention, in the case of a negative working material, is any amount sufficient to catalyze coupling of the silsesquioxane polymer upon exposure to actinic radiation to render the coupled portion insoluble in an aqueous developer. The photoactive component is typically present in the composition in an amount of from 0.1 to 25 wt %, more specifically from 0.1 to 12 wt %.

One or more flexibilizer can optionally be included in the compositions of the invention to impart a desired amount of flexibility to coatings or other products formed from the compositions. It may, for example, be beneficial to add a flexibilizer to compositions used in forming relatively thick coatings, such as those on the order of three or more microns, which have an increased susceptibility to the formation of cracks. Suitable flexibilizer materials include, for example, polysiloxanes and plasticizers such as long chain alkyds. Typically, the flexibilizer has two or more groups in its chain that are capable of coupling with the silsesquioxane polymer. Preferred such groups include hydroxy, alkoxy, carboxyester, amino, amido, epoxy, imino, carboxyacid, anhydride, olefinic, acrylic, acetal, orthoester, vinyl ether, and combinations thereof. Of these groups, hydroxy is particularly preferred. Exemplary polysiloxane flexibilizer materials include polysiloxanes terminated with functional groups such as silanol-terminated polydiphenyl-siloxanes and silanol-terminated polydimethylsiloxanes, typically in which the endgroups consist only of functional groups or flexible silsesquioxane polymers, for example, those formed from reacting 33 wt % methyl-triethoxy-silane, 33 wt % phenyl-triethoxy-silane, and 33 wt % dimethyl(dialkyl)-diethoxy-silane. The flexibilizer is typically present in the composition in an amount of less than 30 wt %, more specifically less than 20 wt %.

Other additives may optionally be present in the compositions of the invention including, but are not limited to, surface leveling agents, wetting agents, antifoam agents, adhesion promoters, thixotropic agents, and the like. Such additives are well known in the art for coating compositions. The use of surface leveling agents, for example silicone-base oils such as SILWET L-7604 silicone-base oil available from Dow Chemical Company, in the inventive compositions has been found to provide beneficial results. It will be appreciated that more than one additive may be combined in the compositions of the present invention. For example, a wetting agent may be combined with a thixotropic agent. Such optional additives are commercially available from a variety of sources. The amounts of such optional additives to be used in the present compositions will depend on the particular additive and desired effect, and are within the ability of those skilled in the art. Such other additives are typically present in the composition in an amount of less than 5 wt %, more specifically less than 2.5 wt %.

The compositions of the invention can optionally contain one or more organic cross-linking agents. Cross-linking agents include, for example, materials which link up components of the composition in a three-dimensional manner. Any aromatic or aliphatic cross-linking agent that reacts with the silsesquioxane polymer is suitable for use in the present invention. Such organic cross-linking agents will cure to form a polymerized network with the silsesquioxane polymer, and reduce solubility in a developer solution. Such organic cross-linking agents may be monomers or polymers. It will be appreciated by those skilled in the art that combinations of cross-linking agents may be used successfully in the present invention.

Suitable organic cross-linking agents useful in the present invention include, but are not limited to: amine containing compounds, epoxy containing materials, compounds containing at least two vinyl ether groups, allyl substituted aromatic compounds, and combinations thereof. Preferred cross-linking agents include amine containing compounds and epoxy containing materials.

The amine containing compounds useful as cross-linking agents in the present invention include, but are not limited to: a melamine monomers, melamine polymers, alkylolmethyl melamines, benzoguanamine resins, benzoguanamine-formaldehyde resins, urea-formaldehyde resins, glycoluril-formaldehyde resins, and combinations thereof.

Epoxy containing materials useful as cross-linkers in the present invention are any organic compounds having one or more oxirane rings that are polymerizable by ring opening.

The compositions of the present invention may suitably comprise only a single type of organic cross-linker, for example, only an amine containing cross-linker, or may contain two or more different cross-linkers. It will be appreciated by those skilled in the art that suitable organic cross-linker concentrations will vary with factors such as cross-linker reactivity and specific application of the composition. When used, the cross-linking agent(s) is typically present in the composition in an amount of from 0.1 to 50 wt %, more specifically from 0.5 to 25 wt %, and even more specifically from 1 to 20 wt %.

The present compositions can optionally contain one or more solvents. Such solvents aid in formulating the present compositions and in coating the present compositions on a substrate. A wide variety of solvents may be used. Suitable solvents include, but are not limited to, glycol ethers, such as ethylene glycol monomethyl ether, propylene glycol monomethyl ether, dipropylene glycol monomethyl ether; esters such asmethyl cellosolve acetate, ethyl cellosolve acetate, propylene glycol monomethyl ether acetate, dipropylene glycol monomethyl ether acetate, dibasic esters, carbonates such as propylene carbonate, γ-butyrolactone, esters such as ethyl lactate, n-amyl acetate and n-butyl acetate, alcohols such as n-propanol, iso-propanol, ketones such as cyclohexanone, methyl isobutyl ketone, diisobutyl ketone and 2-heptanone, lactones such as γ-butyrolactone and ε-caprolactone, ethers such as diphenyl ether and anisole, hydrocarbons such as mesitylene, toluene and xylene, and heterocyclic compounds such as N-methyl-2-pyrrolidone, N,N'-dimethylpropyleneurea, or mixtures thereof.

The photodefinable compositions of the present invention can be prepared by combining, in admixture, the silsesquioxane polymer, the photoactive component, and other optional components in any order.

The present photodefinable compositions are particularly suitable for use in the manufacture of optical waveguides. Optical waveguides can be used in forming opto-electrical devices including, but not limited to, splitters, couplers, spectral filters, polarizers, isolators, multiplexers such as wavelength division multiplexing structures, amplifiers, attenuators, switches, and the like.

The compositions in accordance with the present invention allow for the preparation of waveguides by direct imaging. The waveguides of the present invention may be manufactured as individual waveguides or as an array of waveguides. Thus, the present invention provides a method of forming an optical waveguide, including the steps of: (a) depositing over a substrate a layer of the photodefinable composition described above, wherein the layer has a higher refractive index than the substrate; (b) exposing a portion of the layer to actinic radiation; and (c) developing the exposed layer, thereby forming a core structure.

The compositions of the invention are typically first disposed as a layer on a substrate by any means including, but not limited to, screen printing, curtain coating, roller coating, slot coating, spin coating, flood coating, electrostatic spray, spray coating, or dip coating. When the compositions of the present invention are spray coated, a heated spray gun may optionally be used. The viscosity of the composition may be adjusted to meet the requirements for each method of application by viscosity modifiers, thixotropic agents, fillers and the like. Typically, the layer is coated to a thickness of from about 1 to 100 $\mu$m, and more specifically from about 8 to 60 $\mu$m Any substrate suitable for supporting a waveguide may be used with the present compositions. Suitable substrates include, but are not limited to, substrates used in the manufacture of electronic devices such as printed wiring boards and integrated circuits. Particularly suitable substrates include laminate surfaces and copper surfaces of copper clad boards, printed wiring board inner layers and outer layers, wafers used in the manufacture of integrated circuits such as silicon, gallium arsenide, and indium phosphide wafers, glass substrates including but not limited to liquid crystal display ("LCD") glass substrates, dielectric coatings, cladding layers, and the like.

The coated substrate is typically then cured, such as by baking, to remove any solvent in the coating. Such curing may take place at various temperatures, depending upon the particular solvent chosen. Suitable temperatures are any that are sufficient to substantially remove any solvent present. Typically, the curing may be at any temperature from room temperature (25° C.) to 170° C. Such curing typically occurs over a period of from 5 seconds to 30 minutes. Such curing may be affected by heating the substrate in an oven or on a hot plate.

After curing, the layer of the present composition disposed on the substrate is then imaged by exposure to actinic radiation. Such methods include, for example, contact imaging, projection imaging, and laser direct write imaging. The exposure pattern defines the geometry of the waveguide, which is typically but not necessarily on the order of centimeters to meters in length, and microns to hundreds of microns in width. Following exposure, the composition can be cured, typically at a temperature of from 40° to 170° C. Curing time may vary but is generally from about 30 seconds to about 1 hour. While not intending to be bound by theory, it is believed that, in the case of a negative-working material, upon exposure to actinic radiation the silsesquioxane polymer couples, rendering the exposed areas less soluble in a developer solution than the unexposed areas.

The unexposed areas may be removed, such as by contact with a suitable developer, leaving only the exposed areas remaining on the substrate. The invention is advantageously developable in an aqueous developer solution. Suitable aqueous developers include, for example, alkali metal hydroxides such as sodium hydroxide and potassium hydroxide in water, as well as tetraalkylammonium hydroxide such as tetramethylammonium hydroxide, in water. Such developers are typically used in concentrations from 0.1 to 2N, more specifically 0.15 to 1N, even more specifically 0.26 to 0.7N. The developer solutions may optionally include one or more known surfactants, such as polyethylene glycol, alkyl sulfonates, and other surfactants well known in the art. The surfactant is typically present in the developer in an amount of from 0.5 to 3 wt %.

Such development may be at a variety of temperatures such as from room temperature to about 65° C., typically from 21 to 49° C. Development time with aggressive agitation is typically within ten minutes, preferably five minutes, more preferably within two minutes, even more preferably within one minute, and still more preferably within 30 seconds.

Following development, the present waveguides may undergo a final cure step. The curing can, for example, include a flood exposure, for example, with 1 to 2 Joules/$cm^2$ of actinic radiation. Additionally or alternatively, the waveguides may be heated at a temperature of from about 130° to 300° C. in air or an inert atmosphere such as nitrogen or argon.

In a preferred aspect of the invention, a waveguide is formed by depositing core and cladding layers, wherein the cladding has a lower index of refraction as compared to the core. Particularly useful waveguides include a core having an index of refraction of from 1.4 to 1.7 and a cladding having an index of refraction of from 1.3 to 1.69.

In accordance with this aspect of the invention, a first cladding layer can be deposited on the substrate prior to deposition of the core layer, and a second cladding layer can be deposited on the patterned core. Suitable compositions for the cladding material include the photoimageable compositions described above with respect to the core, as well as those compositions absent the photoactive component. Thus, for a given waveguide, the same composition used in forming the core, absent the photoactive component, can be used in forming the associated cladding material. Typically, but not necessarily, the first and second cladding layers can be formed from the same composition.

In forming waveguides according to this aspect of the invention, a first cladding layer is formed on the substrate surface. This can be performed using any of the techniques described above with reference to the core coating. The first cladding layer can be cured, for example, thermally or photolytically. Typically, the thermal curing temperature is from 130° C. to 300° C. Such curing typically occurs over a period of from five seconds to one hour. Such curing may be affected by heating the substrate in an oven or on a hot plate. Additionally or alternatively, the waveguide can be flood exposed, for example, with 1 to 2 Joules/$cm^2$ of actinic radiation.

After curing of the first cladding layer, a core pattern is formed as described above. Next, a second cladding layer is formed over the first cladding layer and core structure. The second cladding layer may be the same or different from the first cladding layer. However, the indices of refraction of the first and second cladding layers should be approximately the same. The second cladding layer is then thermally cured and/or photo-exposed to provide a waveguide structure.

Typically, the first cladding layer is deposited to a thickness of from about 1 to 100 μm, more specifically from about 10 to 50 μm, and the second cladding layer is deposited to a thickness of from about 1 to 100 μm, even more specifically from about 10 to 50 μm.

Optical waveguides of the present invention possess excellent transparencies at a variety of wavelengths. Thus, the present optical waveguides may be used at, for example, 600 to 1700 nm. It will be appreciated that the present optical waveguides may be advantageously used at other wavelengths. Thus, the present optical waveguides are particularly suited for use in data communications and telecommunications applications.

Thus, the present invention further provides an optical waveguide that has a core and a cladding, wherein the core is formed from any of the above-described photodefinable compositions.

The waveguides of the present invention may be used in a variety of applications, particularly in the manufacture of opto-electronic devices, such as in couplers, spectral filters, polarizers, isolators, multiplexers, attenuators, switches, and the like or, on a larger scale, in electronic devices such as printed wiring boards, integrated circuits, interconnects, and the like. As used herein, the term electronic device is intended to encompass opto-electronic devices, for example, those described above, as well as the aforementioned larger scale devices that include an opto-electronic device.

The following examples are intended to illustrate further various aspects of the present invention, but are not intended to limit the scope of the invention in any aspect.

EXAMPLES

Example 1

50 wt % propylene glycol monomethyl ether acetate, 49 wt % phenyl-methyl silsesquioxane (50:50), 0.99 wt % triphenylsulfonium hexafluorophosphate, and 0.01 wt % Dow SILWET L-7604 silicone-base oil are combined in admixture. The composition is spin-coated at 2000 rpm onto a six-inch silicon dioxide-coated silicon wafer and soft-baked in air on a hot plate for two minutes at 90° C., to a thickness of 8 μm. Artwork defining the required waveguide is placed directly on the composition. The artwork includes patterns for forming waveguides of various dimensions and shapes, such as linear, branched, and curved shaped waveguides between 2 and 14 cm in length and 5 to 15 μm in length. 800 mJ/$cm^2$ of actinic radiation is applied to the construction followed by a post-exposure-bake in air at 90° C. for two minutes. The exposed wafer is then dipped in a 0.7N sodium hydroxide developer solution held at 37.8° C. (100° F.) for 30 seconds. The wafer is then rinsed in de-ionized water and dried. Optical waveguides are thereby formed.

Example 2

37 wt % propylene glycol monomethyl ether acetate, 53 wt % phenyl-methyl silsesquioxane (80:20), 5 wt % triphenylsulfonium trifluoromethylsulphonate, 4.99 wt % polyphenylsiloxane, and 0.01 wt % Dow SILWET L-7604 silicone-base oil are combined in admixture. The composition is spin-coated at 3000 rpm onto a six-inch silicon dioxide-coated silicon wafer and soft-baked in air on a hot plate for two minutes at 90° C., to a thickness of 8 μm. Artwork as described in Example 1 is placed directly on the composition. 500 mJ/$cm^2$ of actinic radiation is applied to the construction followed by a post-exposure-bake in air at 90° C. for two minutes. The exposed wafer is then dipped in a 0.7N sodium hydroxide developer solution held at 21° C. for 30 seconds. The wafer is then rinsed in de-ionized water and dried. The wafer is heated to 200° C. for 10 minutes. Optical waveguides are thereby formed.

Example 3

37 wt % propylene glycol monomethyl ether acetate, 53 wt % phenyl-methyl silsesquioxane (50:50), 5 wt % triphenylsulfonium trifluoromethylsulphonate, 4.99 wt % polyphenylsiloxane, and 0.01 wt % Dow SILWET L-7604 silicone-base oil are combined in admixture. The composition is spin-coated at 3000 rpm onto a six-inch silicon dioxide-coated silicon wafer and soft-baked in air on a hot plate for two minutes at 90° C., to a thickness of 8 μm. Artwork as described in Example 1 is placed directly on the composition. The exposed wafer is then dipped in a 0.35N sodium hydroxide developer solution held at 37.8° C. (100° F.) for 60 seconds. The wafer is then rinsed in de-ionized water and dried. Optical waveguides are thereby formed.

Example 4

37 wt % ethyl lactate, 53 wt % of the condensation reaction product of 45 wt % phenyl-triethoxysilane, 45 wt % methyl-triethoxysilane, and 10 wt % dimethyl-diethoxysilane, 5 wt % of the condensation reaction product of 33% phenyl-triethoxysilane, 33 wt % methyl-triethoxysilane, and 34 wt % dimethyl-diethoxysilane, 4.99 wt % 2,4-bis-(trichloromethyl)-6-(4-ethoxyethoxy-1-naphthyl)-triazine, and 0.01 wt % Dow SILWET L-7604 silicone-base oil are combined in admixture. The composition is spin-coated at 3000 rpm onto a six-inch LCD glass substrate and soft-baked in air on a hot plate for two minutes at 90° C., to a thickness of 8 μm. Artwork as described in Example 1 is placed directly on the composition. 800 mJ/cm$^2$ of actinic radiation is applied to the wafer followed by a post-exposure-bake in air at 90° C. for two minutes. The exposed wafer is then dipped in a 0.26N sodium hydroxide developer solution held at 37.8° C. (100° F.) for 90 seconds. The wafer is then rinsed in de-ionized water and dried. Optical waveguides are thereby formed.

Example 5

37 wt % ethyl lactate, 53 wt % of the condensation reaction product of 45 wt % phenyl-triethoxysilane, 45 wt % methyl-triethoxysilane, and 10 wt % dimethyl-diethoxysilane, 5 wt % of polydiethoxysiloxane, 4.99 wt % triphenylsulfonium hexafluorophosphate, and 0.01 wt % Dow SILWET L-7604 silicone-base oil are combined in admixture. The composition is roller-coated onto an epoxy laminate, such as commonly used in printed wiring board manufacture, to a thickness of 50 μm and dried in air in a convection oven for 30 minutes at 90° C. The structure is annealed in air at a starting temperature of 90° C. ramped down to room temperature at a rate of two degrees per minute. Artwork as described in Example 1, but with lines of 40 to 200 μm in width, is placed directly on the composition. 1000 mJ/cm$^2$ of actinic radiation is applied to the construction followed by a post-exposure-bake in air at 90° C. for 30 minutes. The exposed structure is then dipped in a 0.7N sodium hydroxide developer solution held at 37.8° C. (100° F.) for 60 seconds. The laminate is then rinsed in de-ionized water and dried. The resultant waveguides are flood-exposed to 1000 mJ/cm$^2$ of actinic radiation, followed by a hard-cure at 200° C. for 60 minutes in air in a convection oven. Optical waveguides are thereby formed.

Example 6

37 wt % propylene glycol monomethyl ether acetate, 53 wt % of the condensation reaction product of 49 wt % phenyl-triethoxysilane, 49 wt % methyl-triethoxysilane, and 2 wt % dimethyl-diethoxysilane, 5 wt % polydiphenylsiloxane, 4.95 wt % triphenylsulfonium trifluoromethylsulfonate, and 0.05 wt % Dow SILWET L-7604 silicone-base oil are combined in admixture. The composition is spin-coated at 2500 rpm onto a six-inch silicon dioxide-coated silicon wafer and soft-baked in air on a hot plate for two minutes at 90° C., to a thickness of 8 μm. Artwork as described in Example 1 is placed directly on the composition. 800 mJ/cm$^2$ of actinic radiation is applied to the construction followed by a post-exposure-bake in air at 90° C. for two minutes. The exposed wafer is then dipped in a 0.7N sodium hydroxide developer solution held at 37.8° C. (100° F.) for 60 seconds. The wafer is then rinsed in de-ionized water and dried. The wafer is heated to 200° C. in air for 10 minutes on a hot plate. Optical waveguides are thereby formed.

Example 7

37 wt % propylene glycol monomethyl ether acetate, 53 wt % of the condensation reaction product of 79 wt % phenyl-triethoxysilane, 19 wt % trifluoromethyl-triethoxysilane, and 2 wt % dimethyl-diethoxysilane, 5 wt % polydiphenylsiloxane, 4.95 wt % triphenylsulfonium hexafluorophosphate, and 0.05 wt % Dow SILWET L-7604 silicone-base oil are combined in admixture. The composition is spin-coated at 2500 rpm onto a six-inch silicon dioxide-coated silicon wafer and soft-baked in air on a hot plate for two minutes at 90° C., to a thickness of 8 μm. Artwork as described in Example 1 is placed directly on the composition. 800 mJ/cm$^2$ of actinic radiation is applied to the construction followed by a post-exposure-bake in air at 90° C. for two minutes. The exposed wafer is then dipped in a 0.26N tetramethyl ammonium hydroxide developer solution held at 37.8° C. (100° F.) for 60 seconds. The wafer is then rinsed in de-ionized water and dried. The wafer is heated to 200° C. in air for 10 minutes on a hot plate. Optical waveguides are thereby formed.

Example 8

35 wt % propylene glycol monomethyl ether acetate, 10 wt % anisole, 45 wt % of the condensation reaction product of 49 wt % phenyl-triethoxysilane, 49 wt % butyl-triethoxysilane, and 2 wt % dimethyl-diethoxysilane, 5 wt % polydiethoxysiloxane, 4.95 wt % triphenylsulfonium trifluoromethylsulfonate, and 0.05 wt % Dow SILWET L-7604 silicone-base oil are combined in admixture. The composition is spin-coated at 2500 rpm onto a six-inch silicon dioxide-coated silicon wafer and soft-baked in air on a hot plate for two minutes at 90° C., to a thickness of 8 μm. Artwork as described in Example 1 is placed directly on the composition. 800 mJ/cm$^2$ of actinic radiation is applied to the construction followed by a post-exposure-bake in air at 90° C. for two minutes. The exposed wafer is then dipped in a 0.7N sodium hydroxide developer solution held at 37.8° C. (100° F.) for 60 seconds. The wafer is then rinsed in de-ionized water and dried. The wafer is heated to 200° C. in air for 10 minutes on a hot plate. Optical waveguides are thereby formed.

Example 9

45 wt % propylene glycol monomethyl ether acetate, 45 wt % of the condensation reaction product of 49 wt % phenyl-triethoxysilane, 49 wt % methyl-triethoxysilane, and 2 wt % dimethyl-diethoxysilane, 5 wt % polydiphenylsiloxane, 4.95 wt % benzoin tosylate, and 0.05 wt % Dow SILWET L-7604 silicone-base oil are combined in admixture. The composition is spin-coated at 2500 rpm onto a six-inch silicon dioxide-coated silicon wafer and soft-baked in air on a hot plate for two minutes at 90° C., to a thickness of 8 μm. Artwork as described in Example 1 is placed directly on the composition. 2000 mJ/cm$^2$ of actinic radiation is applied to the construction followed by a postexposure-bake in air at 90° C. for two minutes. The exposed wafer is then dipped in a 0.35N sodium hydroxide developer solution held at 37.8° C. (100° F.) for 60 seconds. The wafer is then rinsed in de-ionized water and dried. The wafer is heated to 200° C. in air for 10 minutes on a hot plate. Optical waveguides are thereby formed.

Example 10

37 wt % propylene glycol monomethyl ether acetate, 53 wt % of the condensation reaction product of 49 wt % phenyl-triethoxysi lane, 49 wt % methyl-triethoxysilane, and 2 wt % dimethyl-diethoxysilane, 5 wt % polydiphenylsiloxane, 4.90 wt % triphenylsulfonium trifluoromethylsulfonate, 0.05 wt % Dow SILWET L-7604 silicone-base oil, and 0.05 wt % malonic acid are combined in admixture. The composition is spin-coated at 2000 rpm onto a six-inch silicon dioxide-coated silicon wafer and soft-baked in air on a hot plate for two minutes at 90° C., to a thickness of 8 µm. Artwork as described in Example 1 is placed directly on the composition. 800 mJ/cm² of actinic radiation is applied to the construction followed by a post-exposure-bake in air at 90° C. for two minutes. The exposed wafer is then dipped in a 0.7N sodium hydroxide developer solution held at 37.8° C. (100° F.) for 60 seconds. The wafer is then rinsed in de-ionized water and dried. The wafer is heated to 200° C. in air for 10 minutes on a hot plate. Optical waveguides are thereby formed.

Example 11

41 wt % propylene glycol monomethyl ether acetate, 41 wt % of the condensation reaction product of 65 wt % phenyl-triethoxysilane, 33 wt % methyl-triethoxysilane, and 2 wt % dimethyl-diethoxysilane, 10 wt % hexamethylolmethane-melamine, 4 wt % polydiethoxysiloxane, 3.95 wt % triphenylsulfonium trifluoromethylsulfonate, and 0.05 wt % Dow SILWET L-7604 silicone-base oil are combined in admixture. The composition is spin-coated at 2000 rpm onto a six-inch silicon dioxide-coated silicon wafer and soft-baked in air on a hot plate for two minutes at 90° C., to a thickness of 8 µm. Artwork as described in Example 1 is placed directly on the composition. 800 mJ/cm² of actinic radiation is applied to the construction followed by a post-exposure-bake in air at 90° C. for two minutes. The exposed wafer is then dipped in a 0.7N sodium hydroxide developer solution held at 37.8° C. (100° F.) for 30 seconds. The wafer is then rinsed in de-ionized water and dried. The wafer is heated to 200° C. in air for 10 minutes on a hot plate. Optical waveguides are thereby formed.

Example 12

50 wt % propylene glycol monomethyl ether acetate, 49 wt % phenyl silsesquioxane, 0.99 wt % triphenylsulfonium hexafluorophosphate, and 0.01 wt % Dow SILWET L-7604 silicone-base oil are combined in admixture. The composition is spin-coated at 2000 rpm onto a six-inch silicon dioxide-coated silicon wafer and soft-baked in air on a hot plate for two minutes at 90° C., to a thickness of 8 µm. Artwork as described in Example 1 is placed directly on the composition. 800 mJ/cm² of actinic radiation is applied to the construction followed by a post-exposure-bake in air at 90° C. for two minutes. The exposed wafer is then dipped in a 0.7N sodium hydroxide developer solution held at 21° C. for 60 seconds. The wafer is then rinsed in de-ionized water and dried. Optical waveguides are thereby formed.

Example 13

37 wt % propylene glycol monomethyl ether acetate, 53 wt % methyl silsesquioxane, 5 wt % triphenylsulfonium trifluoromethylsulphonate, 4.99 wt % polyphenylsiloxane, and 0.01 wt % Dow SILWET L-7604 silicone-base oil are combined in admixture. The composition is spin-coated at 3000 rpm onto a six-inch silicon dioxide-coated silicon wafer and soft-baked in air on a hot plate for two minutes at 90° C., to a thickness of 8 µm. Artwork as described in Example 1 is placed directly on the composition. 500 mJ/cm² of actinic radiation is applied to the construction followed by a post-exposure-bake in air at 90° C. for two minutes. The exposed wafer is then dipped in a 0.26N tetramethyl ammonium hydroxide developer solution held at 21° C. for 60 seconds. The wafer is then rinsed in de-ionized water and dried. The wafer is heated to 200° C. for 10 minutes. Optical waveguides are thereby formed.

Example 14

41 wt % propylene glycol monomethyl ether acetate, 41 wt % of the condensation reaction product of 65 wt % phenyl-triethoxysilane, 33 wt % methyl-triethoxysilane, and 2 wt % dimethyl-diethoxysilane, 10 wt % hexamethylolmethane-melamine, 4 wt % polydiethoxysiloxane, 3.95 wt % triphenylsulfonium trifluoromethylsulfonate, and 0.05 wt % Dow SILWET L-7604 silicone-base oil are combined in admixture. The composition is roller-coated onto 24 inch×36 inch (61 cm×91.4 cm) epoxy laminate, such as is commonly used in printed wiring board manufacture, to a thickness of 60 µm. The composition is then dried in air in a convection oven for 45 minutes at 90° C. Artwork as described in Example 1, but with line widths of 40 to 200 µm, is placed directly on the composition. 1000 mJ/cm² of actinic radiation is applied to the construction, followed by a post-exposure-bake in air at 90° C. for 30 minutes. The exposed structure is then placed into a spray developer containing 0.7N sodium hydroxide developer solution held at 37.8° C. (100° F.) for a total of 120 seconds. The laminate is rinsed in de-ionized water and dried. The resultant waveguides are flood-exposed with 2000 mJ/cm² of actinic radiation, followed by hard cure at 180° C. for 120 minutes in air in a convection oven. Optical waveguides are thereby formed.

Example 15

Clad (1) Layer

A first cladding layer composition is formed by combining in admixture 50 wt % propylene glycol monomethyl ether acetate, 49.99 wt % phenyl-methyl silsesquioxane (50:50), and 0.01 wt % Dow SILWET L-7604 silicone-base oil. The composition is spin-coated at 2000 rpm onto a six-inch silicon dioxide-coated silicon wafer and soft-baked in air on a hot plate for two minutes at 90° C., to a thickness of 7 µm. The composition is then hard-baked in air on a hot plate for ten minutes at 200° C.

Core

The first cladding layer is coated with a core layer and the core layer is patterned using the composition and procedures described in Example 1.

Clad (2) Layer

A second cladding layer composition is formed over the patterned core and first cladding layer using the same composition and procedures used in forming the first cladding layer, except the thickness of the second cladding layer after the soft-bake is 10 µm. Optical waveguides are thereby formed.

Example 16

Clad (1) Layer

A first cladding layer composition is formed by combining in admixture 39 wt % propylene glycol monomethyl ether acetate, 56 wt % phenyl-methyl silsesquioxane (80:20), 4.99 wt % polyphenylsiloxane, and 0.01 wt % Dow SILWET L-7604 silicone-base oil. The composition is spin-coated at 3000 rpm onto a six-inch silicon dioxide-coated silicon wafer and soft-baked in air on a hot plate for two minutes at 90° C., to a thickness of 7 $\mu$m. The composition is then hard-baked in air on a hot plate for ten minutes at 200° C.

Core

The first cladding layer is coated with a core layer and the core layer is patterned using the composition and procedures described in Example 2.

Clad (2) Layer

A second cladding layer composition is formed over the patterned core and first cladding layer using the same composition and procedures used in forming the first cladding layer, except the thickness of the second cladding layer after the soft-bake is 10 $\mu$m. Optical waveguides are thereby formed.

Examples 17–28

Clad (1) Layer

A first cladding layer composition is formed by combining in admixture 37 wt % propylene glycol monomethyl ether acetate, 55.5 wt % phenyl-methyl silsesquioxane (50:50), 2.5 wt % triphenylsulfonium trifluoromethylsulphonate, 4.99 wt % polyphenylsiloxane, and 0.01 wt % Dow SILWET L-7604 silicone-base oil. The composition is spin-coated at 3000 rpm onto a six-inch silicon dioxide-coated silicon wafer and soft-baked in air on a hot plate for two minutes at 90° C., to a thickness of 7 $\mu$m. The composition is blanket-exposed with 1 Joule/cm$^2$ of actinic radiation. The composition is then hard-baked in air on a hot plate for ten minutes at 200° C.

Core

The first cladding layer is coated with a core layer and the core layer is patterned using the composition and procedures described in Examples 1–4 and 6–13, respectively.

Clad (2) Layer

A second cladding layer composition is formed over the patterned core and first cladding layer using the same composition and procedures used in forming the first cladding layer, except the thickness of the second cladding layer after the soft-bake is 10 $\mu$m. Optical waveguides are thereby formed.

Examples 29–40

Clad (1) Layer

A first cladding layer composition is formed by combining in admixture 41 wt % ethyl lactate, 56 wt % of the condensation reaction product of 45 wt % phenyl-triethoxysilane, 45 wt % methyl-triethoxysilane, and 10 wt % dimethyl-diethoxysilane, 2.99 wt % 2,4-bis-(trichloromethyl)-6-(4-ethoxyethoxy-1-naphthyl)-triazine, and 0.01 wt % Dow SILWET L-7604 silicone-base oil. The composition is spin-coated at 3000 rpm onto a six-inch glass wafer and soft-baked in air on a hot plate for two minutes at 90° C., to a thickness of 7 $\mu$m. The composition is blanket-exposed to 1 Joule/cm$^2$ of actinic radiation. The composition is then hard-baked in air on a hot plate for ten minutes at 200° C.

Core

The first cladding layer is coated with a core layer and the core layer is patterned using the composition and procedures described in Examples 1–4 and 6–13, respectively.

Clad (2) Layer

A second cladding layer composition is formed over the patterned core and first cladding layer using the same composition and procedures used in forming the first cladding layer, except the thickness of the second cladding layer after the soft-bake is 10 $\mu$m. Optical waveguides are thereby formed.

Examples 41–52

Clad (1) Layer

A first cladding layer composition is formed by combining in admixture 39 wt % propylene glycol monomethyl ether acetate, 56 wt % phenyl-methyl silsesquioxane (80:20), 4.99 wt % polyphenylsiloxane, and 0.01 wt % Dow SILWET L-7604 silicone-base oil. The composition is spin-coated at 3000 rpm onto a six-inch silicon dioxide-coated silicon wafer and soft-baked in air on a hot plate for two minutes at 90° C., to a thickness of 7 $\mu$m. The composition is then semi-hard-baked in air on a hot plate for five minutes at 140° C.

Core

The first cladding layer is coated with a core layer and the core layer is patterned using the composition and procedures described in Examples 1–4 and 6–13, respectively, except the final hard bakes, where described, are five minutes at 140° C.

Clad (2) Layer

A second cladding layer composition is formed over the patterned core and first cladding layer using the same composition and procedures used in forming the first cladding layer, except the thickness of the second cladding layer after the soft-bake is 10 $\mu$m and instead of a semi-hard bake, a full hard bake is given to the construction in air on a hot plate for 10 minutes at 200° C. Optical waveguides are thereby formed.

Examples 53–64

Clad (1) Layer

A first cladding layer composition is formed by combining in admixture 37 wt % propylene glycol monomethyl ether acetate, 53 wt % of the condensation reaction product of 49 wt % phenyl-triethoxysilane, 49 wt % methyl-triethoxysilane, and 2 wt % dimethyl-diethoxysilane, 5 wt % polydiphenylsiloxane, 4.95 wt % triphenylsulfonium trifluoromethylsulfonate, and 0.05 wt % Dow SILWET L-7604 silicone-base oil are combined in. The composition is spin-coated at 3000 rpm onto a six-inch silicon dioxide-coated silicon wafer and soft-baked in air on a hot plate for two minutes at 90° C., to a thickness of 7 $\mu$m. The composition is then semi-hard-baked in air on a hot plate for five minutes at 140° C.

Core

The first cladding layer is coated with a core layer and the core layer is patterned using the composition and procedures described in Examples 1–4 and 6–13, respectively, except the final hard bakes, where described, are five minutes at 140° C.

Clad (2) Layer

A second cladding layer composition is formed over the patterned core and first cladding layer using the same composition and procedures used in forming the first cladding layer, except the thickness of the second cladding layer after the soft-bake is 10 μm and instead of a semi-hard bake, a full hard bake is given to the construction in air on a hot plate for 10 minutes at 200° C. Optical waveguides are thereby formed.

While the invention has been described in detail with reference to specific embodiments thereof, it will be apparent to one skilled in the art that various changes and modifications can be made, and equivalents employed, without departing from the scope of the claims.

What is claimed is:

1. A photodefinable composition suitable for use in forming an optical waveguide, comprising:
    a silsesquioxane polymer, comprising:
        polymerized units of the formula ($R^1SiO_{1.5}$) and ($R^2SiO_{1.5}$), wherein $R^1$ and $R^2$ are different and are substituted or unsubstituted organic side chain groups and are free of hydroxy groups; and
        two or more functional end groups; and
    a photoactive component,
    wherein the solubility of the silsesquioxane polymer is altered upon exposure to actinic radiation such that the composition is developable in an aqueous developer solution.

2. A method of forming an optical waveguide, comprising:
    (a) depositing over a substrate a layer of the photodefinable composition according to claim 1, wherein the layer has a higher refractive index than the substrate;
    (b) exposing a portion of the layer to actinic radiation; and
    (c) developing the exposed layer, thereby forming a core structure.

3. The method according to claim 2, further comprising depositing a cladding layer over the core structure.

4. The method according to claim 3, wherein the cladding layer comprises a silsesquioxane polymer.

5. The method according to claim 2, wherein one of $R^1$ and $R^2$ is a substituted or unsubstituted aromatic group and the other of $R^1$ and $R^2$ is a substituted or unsubstituted aliphatic group.

6. The method according to claim 5, wherein one of $R^1$ and $R^2$ is a phenyl group and the other of $R^1$ and $R^2$ is a methyl group.

7. The method according to claim 2, wherein the step of developing is conducted by contacting the exposed layer with an aqueous developer solution.

8. The method according to claim 2, wherein the silsesquioxane polymer has a weight average molecular weight of from 500 to 15,000.

9. The method according to claim 2, wherein the silsesquioxane polymer further comprises a polymerized unit of the formula (($R^3)_2SiO$), wherein $R^3$ is a substituted or unsubstituted organic group.

10. The method according to claim 2, wherein the one or more functional end groups comprise one or more hydroxy groups present in an amount of from 0.5 to 15 mole %, based on the polymer.

11. The method according to claim 2, wherein the photoactive component is a photoacid generator.

12. The method according to claim 2, wherein the photodefinable composition further comprises a cross-linking agent.

13. The method according to claim 2, wherein the photodefinable composition further comprises a flexibilizer.

14. The photodefinable composition according to claim 1, wherein one of $R^1$ and $R^2$ is a substituted or unsubstituted aromatic group and the other of $R^1$ and $R^2$ is a substituted or unsubstituted aliphatic group.

15. The photodefinable composition according to claim 14, wherein one of $R^1$ and $R^2$ is a phenyl group and the other of $R^1$ and $R^2$ is a methyl group.

16. The photodefinable composition according to claim 1, wherein the silsesquioxane polymer has a weight average molecular weight of from 500 to 15,000.

17. The photodefinable composition according to claim 1, wherein the silsesquioxane polymer further comprises a unit of the formula (($R^3)_2SiO$), wherein $R^3$ is a substituted or unsubstituted organic group.

18. The photodefinable composition according to claim 1, wherein the two or more functional end groups comprise one or more hydroxy groups present in an amount of from 0.5 to 15 mole %, based on the polymer.

19. The photodefinable composition according to claim 1, wherein the photoactive component is a photoacid generator.

20. The photodefinable composition according to claim 1, further comprising a cross-linking agent.

21. The photodefinable composition according to claim 1, further comprising a flexibilizer.

22. An optical waveguide, comprising a core and a cladding, wherein the core is formed from the photodefinable composition according to claim 1.

23. An electronic device, comprising one or more waveguides according to claim 22.

24. A photodefinable composition suitable for use in forming an optical waveguide, comprising:
    a silsesquioxane polymer, comprising:
        polymerized units of the formula ($RSiO_{1.5}$), wherein R is a substituted or unsubstituted organic side chain group that is free of hydroxy groups; and
        one or more hydroxy end groups; and
    a photoactive component,
    wherein the silsesquioxane polymer has a hydroxy content of from 0.5 to 15 mole %.

25. A method of forming an optical waveguide, comprising:
    (a) depositing over a substrate a layer of the photodefinable composition according to claim 24, wherein the layer has a higher refractive index than the substrate;
    (b) exposing a portion of the layer to actinic radiation; and
    (c) developing the exposed layer, thereby forming a core structure.

26. The method according to claim 25, further comprising depositing a cladding layer over the core structure.

27. The method according to claim 26, wherein the cladding layer comprises a silsesquioxane polymer.

28. The method according to claim 25, wherein the photodefinable composition further comprises a flexibilizer.

29. The method according to claim 25, wherein the step of developing is conducted by contacting the exposed layer with an aqueous developer solution.

30. The method according to claim 25, wherein the photodefinable composition further comprises a cross-linking agent.

31. The method according to claim 25, wherein the photoactive component is a photoacid generator.

32. The method according to claim 25, wherein the silsesquioxane has a weight average molecular weight of from 500 to 15,000.

33. The method according to claim 25, wherein the silsesquioxane polymer further comprises a polymerized unit of the formula $((R^3)_2SiO)$, wherein $R^3$ is a substituted or unsubstituted organic group.

34. The photodefinable composition according to claim 24, wherein the photoactive component is a photoacid generator.

35. The photodefinable composition according to claim 34, further comprising a cross-linking agent.

36. The photodefinable composition according to claim 24, wherein the silsesquioxane polymer has a weight average molecular weight of from 500 to 15,000.

37. The photodefinable composition according to claim 24, wherein the silsesquioxane polymer further comprises a polymerized unit of the formula $((R^3)_2SiO)$, wherein $R^3$ is a substituted or unsubstituted organic group.

38. The photodefinable composition according to claim 24, further comprising a flexibilizer.

39. An optical waveguide, comprising a core and a cladding, wherein the core is formed from the photodefinable composition according to claim 24.

40. An electronic device, comprising one or more waveguides according to claim 39.

* * * * *